United States Patent [19]
Fujiwara

[11] Patent Number: 5,798,548
[45] Date of Patent: Aug. 25, 1998

[54] SEMICONDUCTOR DEVICE HAVING MULTIPLE CONTROL GATES

[75] Inventor: Hideaki Fujiwara, Gifu, Japan

[73] Assignee: Sanyo Electric Co., Ltd., Osaka, Japan

[21] Appl. No.: 649,176

[22] Filed: May 17, 1996

[30] Foreign Application Priority Data

May 18, 1995 [JP] Japan .................................. 7-120128
Apr. 22, 1996 [JP] Japan .................................. 8-100011

[51] Int. Cl.$^6$ ........................... H01L 29/76; H01L 29/788
[52] U.S. Cl. ........................................... 257/319; 257/321
[58] Field of Search ............................. 257/315, 316, 257/319, 321

[56] References Cited

U.S. PATENT DOCUMENTS

| | | | |
|---|---|---|---|
| 4,577,215 | 3/1986 | Stewart et al. | 257/319 |
| 5,111,430 | 5/1992 | Morie | 365/185 |
| 5,194,924 | 3/1993 | Komori et al. | 257/316 |
| 5,464,784 | 11/1995 | Crisenta et al. | 437/43 |
| 5,554,869 | 9/1996 | Chang | 257/316 |

FOREIGN PATENT DOCUMENTS

| | | | |
|---|---|---|---|
| 52-13782 | 2/1977 | Japan | 257/319 |
| 61-216482 | 9/1986 | Japan | 257/316 |

*Primary Examiner*—Olik Chaudhuri
*Assistant Examiner*—Howard Weiss
*Attorney, Agent, or Firm*—Sheridan Ross P.C.

[57] ABSTRACT

A semiconductor device includes a semiconductor substrate, source and drain regions defined in the semiconductor substrate with a channel region therebetween, a first insulating layer located over the semiconductor substrate including over the channel region, a floating gate locating over the first insulating layer, a second insulating layer located over the floating gate, a first control gate located over the second insulating layer, a third insulating layer located over the first control gate, a second control gate located over the third insulating layer. The first and second control gates allow the injection of hot carriers onto the floating gate from the first control gate when predetermined first and second voltages are applied to the first and second control gates, respectively.

9 Claims, 9 Drawing Sheets

| | write | | erase | read | standby |
|---|---|---|---|---|---|
| | selected cell | non-selected cell | | | |
| first word line WLma (second control gate 9) | -3V | -3V | 5V | 3V | 0 |
| second word line WLmb (first control gate 7) | 0 | 0 | 0 | 3 | 0 |
| bit line BLm (drain D) | open | open | 0 | 3 | 0 |
| common source line SL (source S) | open | open | 0 | 0 | 0 |
| well select line P-well | $\begin{bmatrix} WELm \\ 42m \end{bmatrix}$ 0 | $\begin{bmatrix} WELa-WEL\ell, \\ WELn-WELz \\ 42a-42\ell, \\ 42n-42z \end{bmatrix}$ -5V | 0 | 0 | 0 |
| n-type substrate | 0 | 0 | 0 | 0 | 0 |

SEMICONDUCTOR DEVICE HAVING MULTIPLE CONTROL GATES

BACKGROUND OF THE INVENTION

1. Field of the Invention

The present invention relates generally to a semiconductor device and non-volatile semiconductor memory device. More particularly, this invention relates to a semiconductor device which is capable of resetting a preset threshold voltage and to a non-volatile semiconductor memory device with an increased number of allowable rewriting actions.

2. Description of the Related Art

An insulated gate field effect transistor (IGFET) including a metal oxide semiconductor (MOS) and a metal insulator semiconductor (MIS) has a threshold voltage, which is determined in accordance with the thickness of a gate insulating film and the impurity concentration of a channel region. Conventionally, the threshold voltage of an IGFET could not be set again after fabrication. To incorporate a plurality of IGFETs having different threshold voltages in a semiconductor integrated circuit (semiconductor chip), those IGFETs should be prepared separately. This complicates the fabrication process and reduces the throughput, which results in an increase in the manufacturing cost. In addition, it is difficult to incorporate a plurality of different threshold voltages into a single semiconductor chip, thus reducing the freedom of designing a semiconductor integrated circuit.

To reduce consumed power and improve the operation speed, recently there have been some attempts to change the supply voltage to 3.3 V or 2.5 V from +5 V. In some cases, however, the supply voltage for an external devices connected to a semiconductor integrated circuit may differ from the supply voltage for the semiconductor integrated circuit. In such a case, the supply voltage for an input/output circuit included in a semiconductor integrated circuit, which further has an internal circuit, is designed to match the supply voltage for an external device. That is, the threshold voltage of an IGFET included in the input/output circuit is designed to have a different value from that of the threshold voltage of an IGFET included in the internal circuit.

Recently, attention is being paid to flash memory, a semiconductor memory that can take the place of a hard disk and a floppy disk as magnetic memories. Flash memory is included in an electrically erasable and programmable ROM (EEPROM) and is capable of collectively erasing data. An EEPROM and an erasable programmable ROM (EPROM) each have a plurality of memory cells (or memory cell transistors). Each memory cell has a floating gate electrode for retaining carriers (or charges), and a control gate which is used to detect a change in the threshold voltage according to the amount of the carriers retained in the floating gate and to read data. Each memory cell further has a gate insulating film located between the floating gate and the channel region. The injection of carriers onto the floating gate is performed via the gate insulating film. Increased carrier injection energy damages the gate insulating film, and this damage restricts the number of times of that data can be rewritten in memory cells. In other words, every time carriers are injected onto the floating gate, the gate insulating film is damaged. This deteriorates the insulatability of the gate insulating film, degrading the intrinsic performance of memory cells. To ensure a greater number of data rewriting actions, it is necessary to reduce the carrier injection energy as much as possible.

As a solution to reduce the carrier injection energy, a relatively thin gate insulating film may be used. However, the thin gate insulating film increases the leak of carriers from the floating gate, thus shortens the data retaining time of memory cells accordingly. In this respect, memory cells having thin gate insulating films are not practical. Readers should refer to "Flash Memory Technical Handbook", issued by Science Forum, for the structures of the memory cells of an EEPROM and EPROM and a discussion of a damage to the gate insulating film.

As mentioned above, the thickness of the gate insulating film of each memory cell in the conventional EEPROM and EPROM is limited, making it difficult to increase the number of allowable data rewriting actions. Magnetic memories can allow a significantly greater number of data rewriting actions than the EEPROM and EPROM. To use a flash memory in place of a magnetic memory, therefore, it is essential to improve the allowable number of data rewriting actions.

There are two ways of draining carriers from the floating gate of each memory cell in an EEPROM. The first method uses the Fowler-Nordheim (FN) tunnel current, which flows between the channel region (or a source/drain region) and the floating gate via a first gate insulating film located between the floating gate and the channel region (double-layer polysilicon type), and the second method uses the FN tunnel current, which flows between the control gate and the floating gate via a second gate insulating film located between the floating gate and the control gate (three-layer polysilicon type). The first method damages the first gate insulating film at the time of draining carriers from the floating gate, whereas the second method damages the second gate insulating film less than the first gate insulating film.

SUMMARY OF THE INVENTION

Broadly speaking, the present invention relates to a semiconductor device that suppresses the occurrence of damage to a gate insulating film.

The invention also relates to a semiconductor device which includes transistors capable of resetting a preset threshold voltage.

The invention further relates to a non-volatile semiconductor memory device, which includes memory cells having an increased number of allowable rewriting actions.

In one aspect of the invention, a semiconductor device includes a semiconductor substrate, source and drain regions defined in the semiconductor substrate with a channel region therebetween, a first insulating layer located over the semiconductor substrate including over the channel region, a floating gate locating over the first insulating layer, a second insulating layer located over the floating gate, a first control gate located over the second insulating layer, a third insulating layer located over the first control gate, a second control gate located over the third insulating layer. The first and second control gates allow the injection of hot carriers onto the floating gate from the first control gate when predetermined first and second voltages are applied to the first and second control gates, respectively.

In another aspect of the invention, an electrically programmable semiconductor memory device includes a memory cell array and writing means. The memory cell has a plurality pair of first and second row address lines, a plurality of column address lines, a plurality of well select lines corresponding to the plurality of column address lines, a plurality of common wells coupled to the plurality of well select lines and a plurality of memory cells which are selectable by the plurality pair of first and second row address lines and the plurality of column address lines, each of the memory cells having a first and second control gates coupled to an associated one pair of the plurality pair of first and second row address lines, a floating gate, a first impurity region coupled to an associated one of the plurality of column address lines, a second impurity region, the first and second impurity regions being defined in an associated one of the plurality of common wells. The floating gate is capacitively coupled to the first control gate. The first control gate is capacitively coupled to the second control gate. The Writing means applies a predetermined first and a predetermined second write voltages to at least one pair of the plurality pair of first and second row address lines respectively and applies a predetermined third write voltage to at least one of the plurality of well select lines to cause first hot carriers having a first conductivity to be injected onto the floating gate from the first control gate. Thereby, storing data in at least one of the memory cells.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

First Embodiment

A semiconductor device according to the first embodiment of the present invention will be now described referring to the accompanying drawings. According to this embodiment, this invention is adapted to an insulated gate field effect transistor (IGFET) as shown in FIG. 1.

Figure 1:
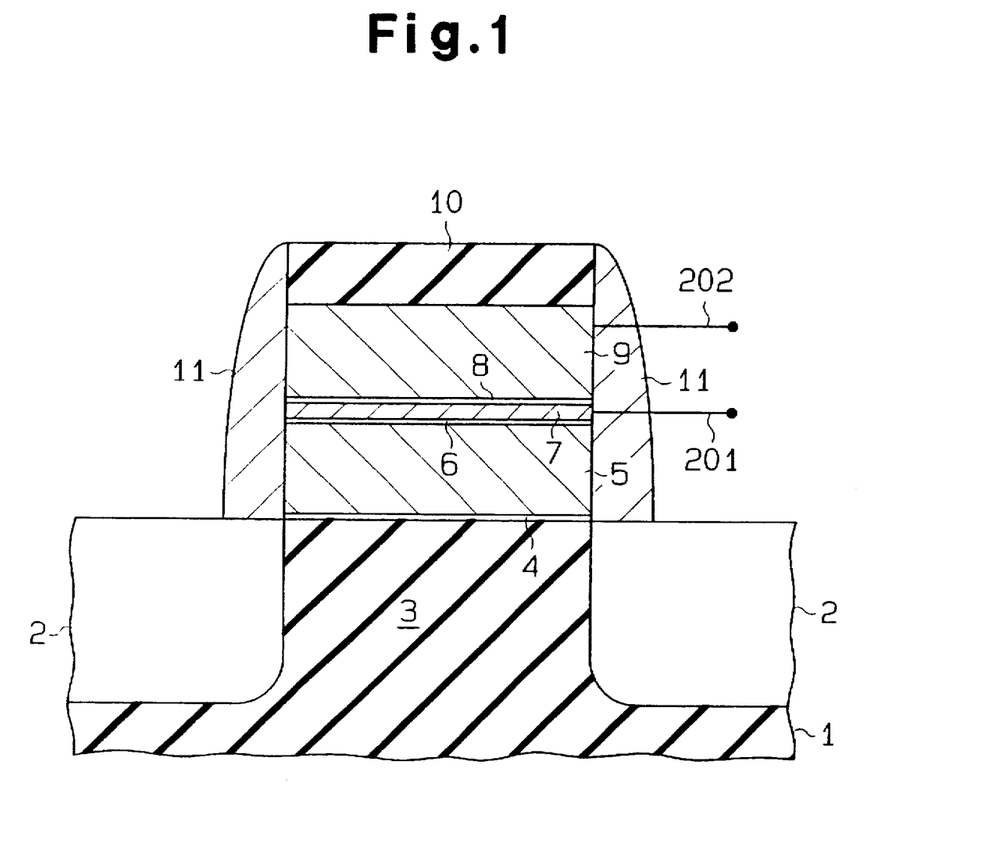
FIG. 1 is a schematic cross-sectional view illustrating an IGFET according to the first embodiment of this invention.

FIG. 1 is a schematic cross-sectional view illustrating an IGFET according to the first embodiment. The IGFET has a monocrystalline silicon substrate 1 as a well. The monocrystalline silicon substrate 1 may be replaced with a well and a semiconductor film including a polysilicon film, an amorphous silicon film and monocrystalline silicon film. First and second source/drain regions 2 are defined on the surface of the silicon substrate 1 with a channel region 3 defined between those regions 2. A first gate oxide film 4 having a thickness of 10 nm is formed on the channel region 3. Formed on the first gate oxide film 4 is a floating gate electrode (hereinafter called "floating gate") 5 which is made of polysilicon and has a thickness of 200 nm. A second gate oxide film 6 having a thickness of 10 nm is formed on the floating gate 5. Formed on the second gate oxide film 6 is a first control gate electrode (hereinafter called "control gate") 7 of polysilicon, which has a thickness of 20 nm. A third gate oxide film 8 having a thickness of 3 nm is formed on the first control gate 7. Formed on the third gate oxide film 8 is a second control gate electrode (hereinafter called "control gate") 9 of polysilicon, which has a thickness of 200 nm. An insulating film 10 having a thickness of 100 nm is formed on the second control gate 9. As apparent from the above, the IGFET according to the first embodiment has the floating gate 5 and the first and second control gates 7 and 9 in a layered structure above the channel region 3, and the first to third gate oxide films 4, 6 and 8 sandwiched therein as shown in FIG. 1. At least one of the floating gate 5 and the first and second control gates 7 and 9 may be formed by a conductive film such as a metal film instead of a doped polysilicon film. At least one of the first to third gate oxide films 4, 6 and 8 may be formed of an oxide film, such as a silicon nitride film or silicate glass, instead of a silicon oxide film. Further, each of the first to third gate oxide films 4, 6 and 8 may be formed by stacking insulating films of a plurality of materials.

The IGFET further has two insulative side wall spacers 11, which are located adjacent to both side walls that are formed by the floating gate 5, the first and second control gates 7 and 9, the first to third gate oxide films 4, 6 and 8 and the insulating film 10. The first and second control gates 7 and 9 are respectively connected to first and second wires 201 and 202 for applying a predetermined voltage from an external device (not shown). It is therefore possible to externally control the voltage to be applied to the first and second control gates 7 and 9.

The application of a predetermined voltage to the first and second control gates 7 and 9 allows the floating gate 5 to retain (or accumulate) hot carriers, such as hot electrons or hot holes having the opposite conductivity to that of the hot electrons. When the floating gate 5 is not retaining hot carriers, the normal first threshold voltage VTnormal of the IGFET is determined by the thickness of the first gate oxide film 4 and the impurity concentration of the channel region 3. According to the first embodiment, the first threshold voltage VTnormal is reset to a second threshold voltage VTestab desired by a user after the fabrication of the IGFET. This resetting is conducted by a manufacturer or a user.

More specifically, to acquire the second threshold voltage VTestab which is higher than the first threshold voltage VTnormal (VTestab>VTnormal), a predetermined amount of hot electrons is injected onto the floating gate 5. This injection of the hot electrons is accomplished by causing the Fowler-Nordheim (FN) tunnel current to flow to the first control gate 7 from the floating gate 5. This FN tunnel current is produced by applying a voltage, higher than the one applied to the second control gate 9, to the first control gate 7. Such control of the voltages to be applied to the first and second control gates 7 and 9 permits a predetermined amount of hot electrons to be injected onto the floating gate 5 from the first control gate 7, with the result that the desired second threshold voltage VTestab can be acquired. When the first threshold voltage VTnormal is 1 V, for example, 5 V is applied to the first control gate 7, 0 V is applied to the second control gate 9 and 5 V is applied to the substrate 1.

Consequently, the second threshold voltage VTestab of about 1.5 V can be obtained. When the first threshold voltage VTnormal is 1 V, 3 V, 0 V and 3 V are respectively applied to the first control gate 7, the second control gate 9 and the substrate 1 for a predetermined period of time. As a result, the second threshold voltage VTestab of about 1.5 V can be obtained. In other words, the desired second threshold voltage VTestab can be also attained by applying the respective voltages to the first and second control gates 7 and 9 for a predetermined time. Further, the provision of the relatively thin second and third gate oxide films 6 and 8 allows hot electrons having relatively small energy of 2 to 3 eV to be injected onto the floating gate 5. In other words, it is possible to fully inject the hot electrons onto the floating gate 5 irrespective of a relatively low differential potential (3 to 5 V) between the first and second control gates 7 and 9.

The hot electrons having energy of 2 to 3 eV show a relatively long mean free path of 20 to 50 nm. This reduces damage to the second gate oxide film 6 which is caused by the interaction occurring between a material such as silicon or silicon oxide and hot electrons. That is, there will not be much damage done on the second gate oxide film 6 by the hot electrons to be injected onto the floating gate 5. The floating gate 5 has a greater thickness (200 nm) than the mean free path (20 to 50 nm) of the hot electrons. That is, the floating gate 5 has a thickness sufficient to absorb the energy of the injected hot electrons. Therefore, the damage to the first gate oxide film 4 is very small if the injected hot electrons reached the first gate oxide film 4. Readers should refer to p. 82 of "Latest Analysis and Evaluation Technique for Solid Surface/Minute Area" by Realize Co., Ltd. for the energy dependency of the mean free path of electrons in a solid.

To acquire the second threshold voltage VTestab which is lower than the first threshold voltage VTnormal (VTestab<VTnormal), a predetermined amount of hot holes is injected onto the floating gate 5. This injection of the hot holes is accomplished by causing the FN tunnel current to flow to the floating gate 5 from the first control gate 7. This tunnel current is produced by applying a voltage, lower than the one applied to the second control gate 9, to the first control gate 7. Such control of the voltages to be applied to the first and second control gates 7 and 9 permits a predetermined amount of hot holes to be injected onto the floating gate 5 from the first control gate 7. As a result, the desired second threshold voltage VTestab can be acquired. As in the case of the injection of hot electrons, the desired second threshold voltage VTestab can be also attained by applying the respective voltages to the first and second control gates 7 and 9 for a predetermined time. Further, the provision of the thin second and third gate oxide films 6 and 8 allows hot holes having relatively small energy of 2 to 3 eV to be injected onto the floating gate 5. In other words, it is possible to fully inject the hot holes onto the floating gate 5 irrespective of a relatively low differential potential (3 to 5 V) between the first and second control gates 7 and 9.

Like the aforementioned hot electrons, the hot holes having energy of 2 to 3 eV show a relatively long mean free path. This reduces damage to the second gate oxide film 6 by the hot holes to be injected onto the floating gate 5. The floating gate 5 has a thickness (200 nm) greater than the mean free path of the hot holes. That is, the floating gate 5 absorbs the energy of the injected hot holes. Therefore, the damage to the first gate oxide film 4 is very small if the injected hot holes reached the first gate oxide film 4.

After the first threshold voltage VTnormal is reset to the second threshold voltage VTestab desired by the user, the same voltage is applied to the first and second control gates 7 and 9 via the wires 201 and 202. Consequently, the hot carriers injected onto the floating gate 5 are retained. The retaining period of the hot carriers is at least ten and some years. Therefore, the reset second threshold voltage VTestab is retained at least ten and some years.

According to the first embodiment, the first threshold voltage can be reset to the second threshold voltage after the fabrication of the IGFET. Therefore, a plurality of IGFETs having different threshold voltages can be incorporated into a semiconductor integrated circuit (semiconductor chip) without being separately prepared. That is, the number of IGFETs having different threshold voltages in a semiconductor chip can be increased, thus widening the design freedom of semiconductor integrated circuits. The injection of hot carriers having a small energy onto the floating gate 5 suppresses damage to the first and second gate oxide films 4 and 6. To allow a user to reset the threshold voltage, a threshold-voltage adjusting pad is provided on a semiconductor chip.

The first embodiment is suitable in the case where the supply voltage for an external device to be connected to the designed semiconductor integrated circuit differs from the supply voltage for this semiconductor integrated circuit. In this case, the supply voltage for an input/output circuit included in a semiconductor integrated circuit, which further has an internal circuit, is designed to match with the supply voltage for an external device. According to the first embodiment, the threshold voltage of an IGFET included in the input/output circuit can be easily set to a different value from that of the threshold voltage of an IGFET included in the internal circuit.

Figure 2A:
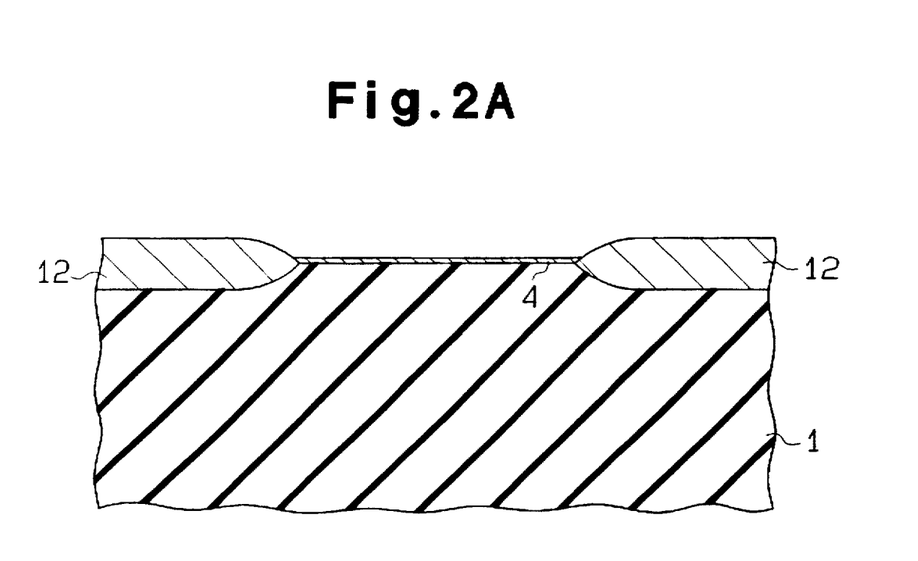
FIG. 2A, 2B and 3 are schematic cross-sectional views illustrating the fabrication process of the IGFET according to the first embodiment.
Figure 2B:
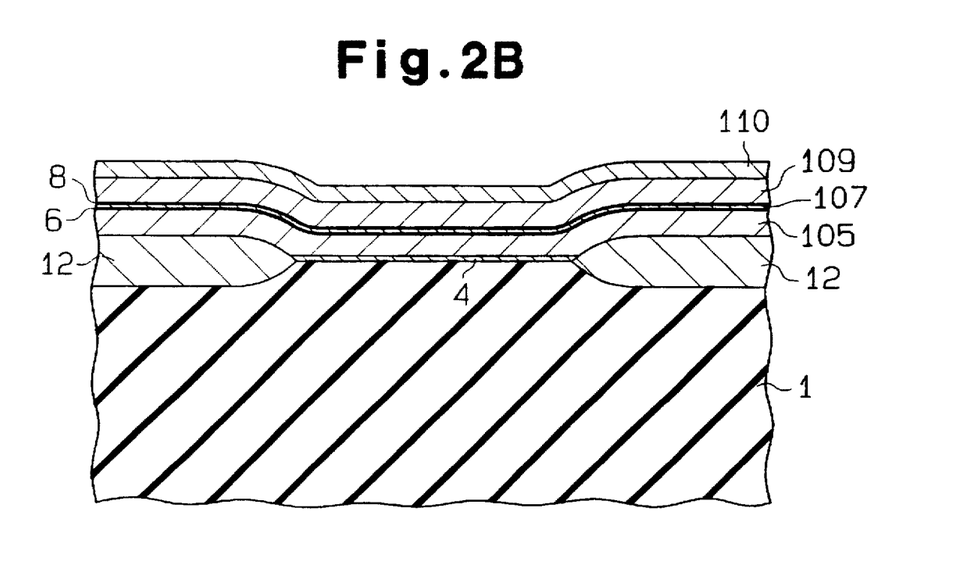
Figure 3:
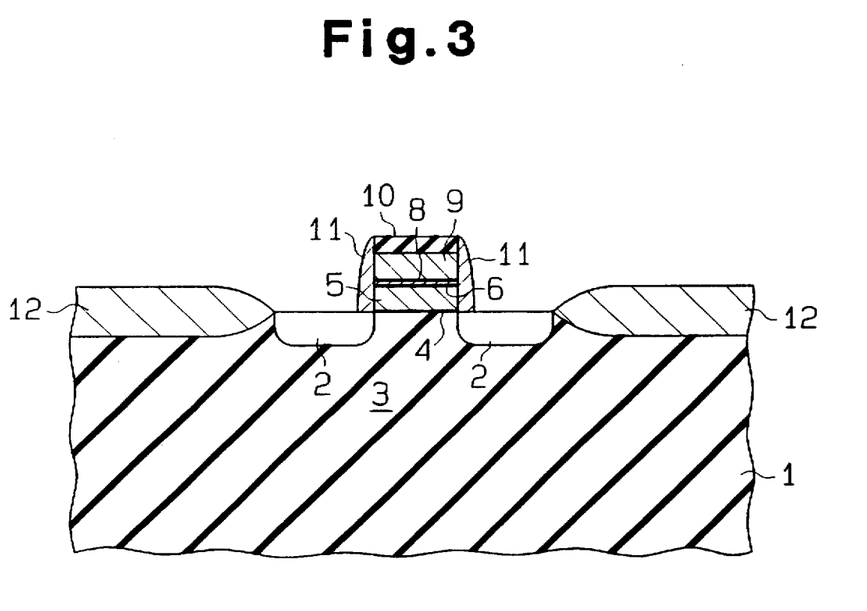

The method of manufacturing the IGFET according to the first embodiment will be now described with reference to FIGS. 2A, 2B and 3.

Step 1 (see FIG. 2A): A field oxide film 12 is locally formed on the monocrystalline silicon substrate 1 by local oxidation on silicon (LOCOS). Then, the first gate oxide film 4 is formed on the substrate 1 by thermal oxidation. It is desirable that the first gate oxide film 4 have a thickness of 5 to 15 nm, and it is most desirable to form the first gate oxide film 4 having a thickness of 8 to 12 nm. The gate oxide film 4 thicker than this range (5 to 15 nm) considerably increases the first threshold voltage VTnormal and the consumed power. The gate oxide film 4 thinner than that range causes the hot carriers retained in the floating gate 5 to leak into the channel region 3, thus shortening the retaining period of the second threshold voltage VTestab.

Step 2 (see FIG. 2B): Six films, namely, a first doped polysilicon film 105, the second gate oxide film 6, a second doped polysilicon film 107, the third gate oxide film 8, a third doped polysilicon film 109 and a silicon oxide film 110 are sequentially formed on the first gate oxide film 4 and field oxide film 12 by CVD. The silicon oxide film may be replaced with an insulating film such as a silicon nitride film or silicate glass. The reference numerals for the first to third gate oxide films in FIG. 2B are the same as the first to third gate oxide films 4, 6 and 8 in FIG. 1.

It is desirable that the second gate oxide film 6 should have a thickness of 5 to 15 nm. The thicker gate oxide film than this range (5 to 15 nm) increases the energy of the hot carriers to be supplied into the floating gate 5. This increases damage to the second gate oxide film 6 caused by the hot carriers passing the floating gate 5, thus damaging the first gate oxide film 4. The thinner gate oxide film than that range causes the hot carriers retained in the floating gate 5 to leak into the channel region 3, thus shortening the retaining period of the second threshold voltage VTestab. It is desirable to form the third gate oxide film 8 having a thickness of 1 to 5 nm, and it is most desirable to form the third gate oxide film 8 whose thickness is 2 to 3 nm. The gate oxide film 8 thicker than this range (1 to 5 nm) increases the energy of injecting hot carriers. The increased injection energy increases damages on the second and third gate oxide films 6 and 8, thus damaging the first gate oxide film 4. Further, the thinner gate oxide film 8 if formed thinner than the range frustrates the acquisition of a differential voltage between the first and second control gates 7 and 9.

Step 3 (see FIG. 3): The individual films 4, 6, 8, 105, 107, 109 and 110 are patterned by anisotropic etching to form the floating gate 5, the first and second polysilicon control gates 7 and 9, and the insulating film 10. It is desirable to form the floating gate 5 whose thickness ranges from 50 to 500 nm. The floating gate 5, if formed thicker than this range (50 to 500 nm), yields the upward protrusion on the IGFET, thus interfering with flattening the device surface. The floating gate 5, if formed thinner than that range, deteriorates the performance of blocking the injected hot carriers so that the hot carriers may damages the first gate oxide film 4. It is desirable to form the first control gate 7 having a thickness ranging from 10 to 100 nm, and it is most desirable that the first control gate 7 have a thickness of 10 to 30 nm. The first control gate 7, if formed thicker than this range (10 to 100 nm), decreases an amount of the hot carriers to be injected. The first control gate 7, if formed thinner than that range, increases the electric resistance of this control gate 7. It is desirable that the second control gate 9 have a thickness ranging from 50 nm to 500 nm, and it is most desirable that the second control gate 9 have a thickness of 100 to 200 nm. The second control gate 9, if formed thicker than this range (50 to 500 nm), interferes with flattening the device surface. The second control gate 9 if, formed thinner than that range, increases the electric resistance of this control gate 9.

Next, impurity ions are injected onto the surface of the substrate 1 by an ion injection method to form the first and second source/drain regions 2. At this time, the first and second source/drain regions 2 are formed in such a way as to provide a sufficient impurity concentration for relaxing the electric field. The ion injection conditions for acquiring such an impurity concentration will be given below. In forming the first and second source/drain regions 2 of an n-type, for example, a p-type monocrystalline silicon substrate 1 is used and phosphorous ions having energy of 50 keV are injected at a dose of $4 \times 10^{-13}$ cm$^{-2}$ After the first and second source/drain regions 2 are formed, an insulating film is formed on the entire device surface. Next, this insulating film is patterned by a full etch-back method to form the side wall spacers 11.

Then, an interlayer insulating film (not shown) is formed on the entire surface of the device, and first and second contact holes are formed at the positions of the interlayer insulating film which correspond to the first and second source/drain regions 2. Further, third and fourth contact holes are formed at the positions of the interlayer insulating film which correspond to the first and second control gates 7 and 9. Next, a conductive film is formed on the entire device surface including the interiors of the first to fourth contact holes and it is then patterned to form first to fourth wires (not shown) which are to be respectively connected to the first and second source/drain electrodes 2 and the first and second control gates 7 and 9. As apparent from the above, an IGFET can be easily fabricated by an ordinary semiconductor manufacturing method.

Second Embodiment

The second embodiment of this invention as adapted to a flash EEPROM will be discussed below with reference to the accompanying drawings. To avoid a redundant description, like or same reference numerals are given to those components which are the same as the corresponding components of the first embodiment.

Figure 4:
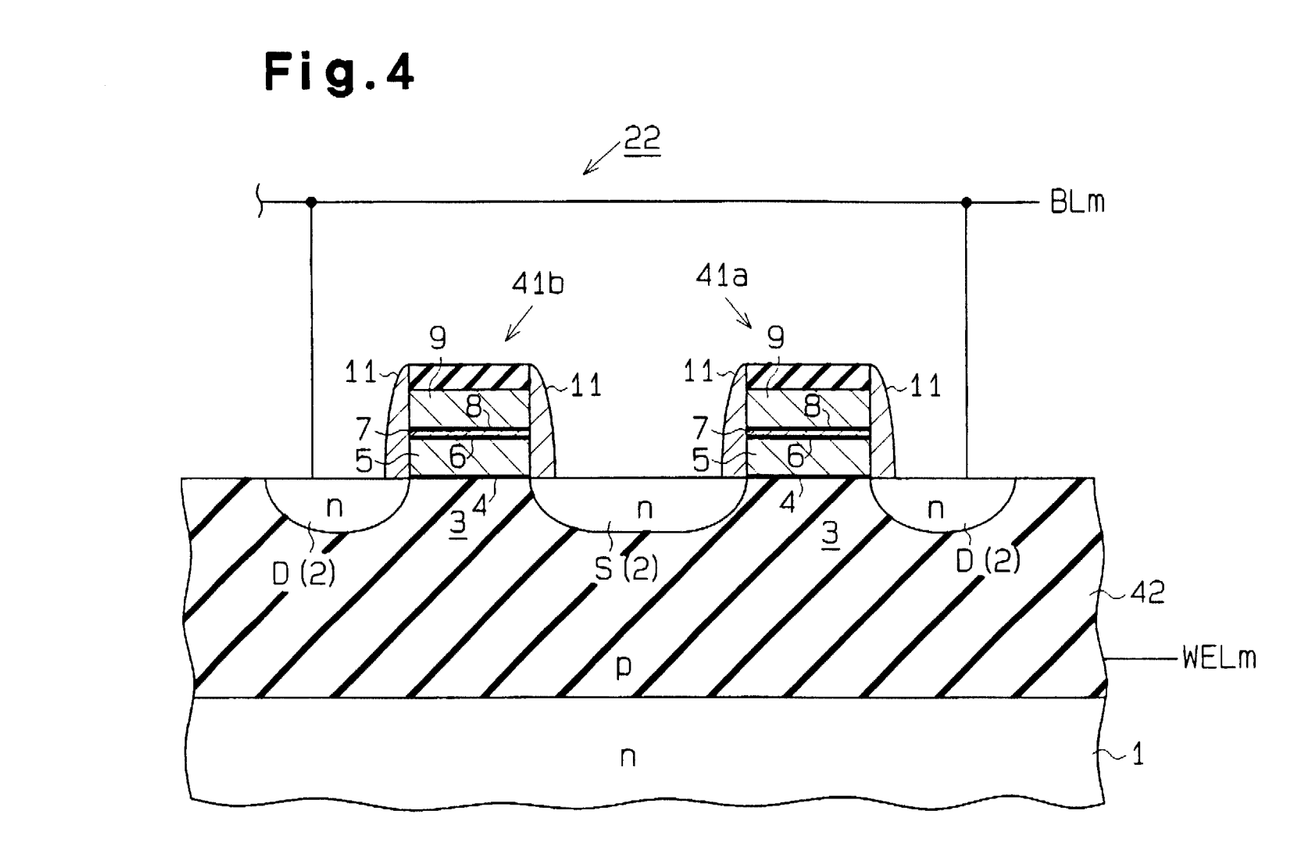
FIG. 4 shows the cross section of a part of a memory cell array of a flash EEPROM according to the second embodiment.

FIG. 4 shows the cross section of a part of a memory cell array 22 of a flash EEPROM 21 according to the second embodiment. This memory cell array 22 has a plurality of memory cells 41 formed on a p well 42, the IGFET of the first embodiment being used for each memory cell 41. The p well 42 is formed on an n type monocrystalline silicon substrate 1. Each memory cell 41 has the same structure as that of the IGFET of the first embodiment except the substrate 1 being replaced with the well 42.

To reduce the occupying area of each memory cell on the substrate 1, two memory cells 41 (hereinafter indicated by "41a" and "41b" to distinguish those two from each other) share n type source region 2 (hereinafter indicated by "S"). N type drain regions 2 (hereinafter indicated by "D") of the memory cells 41a and 41b are connected to an associated one of common bit lines BLa to BLz (e.g., BLm).

Figure 5:
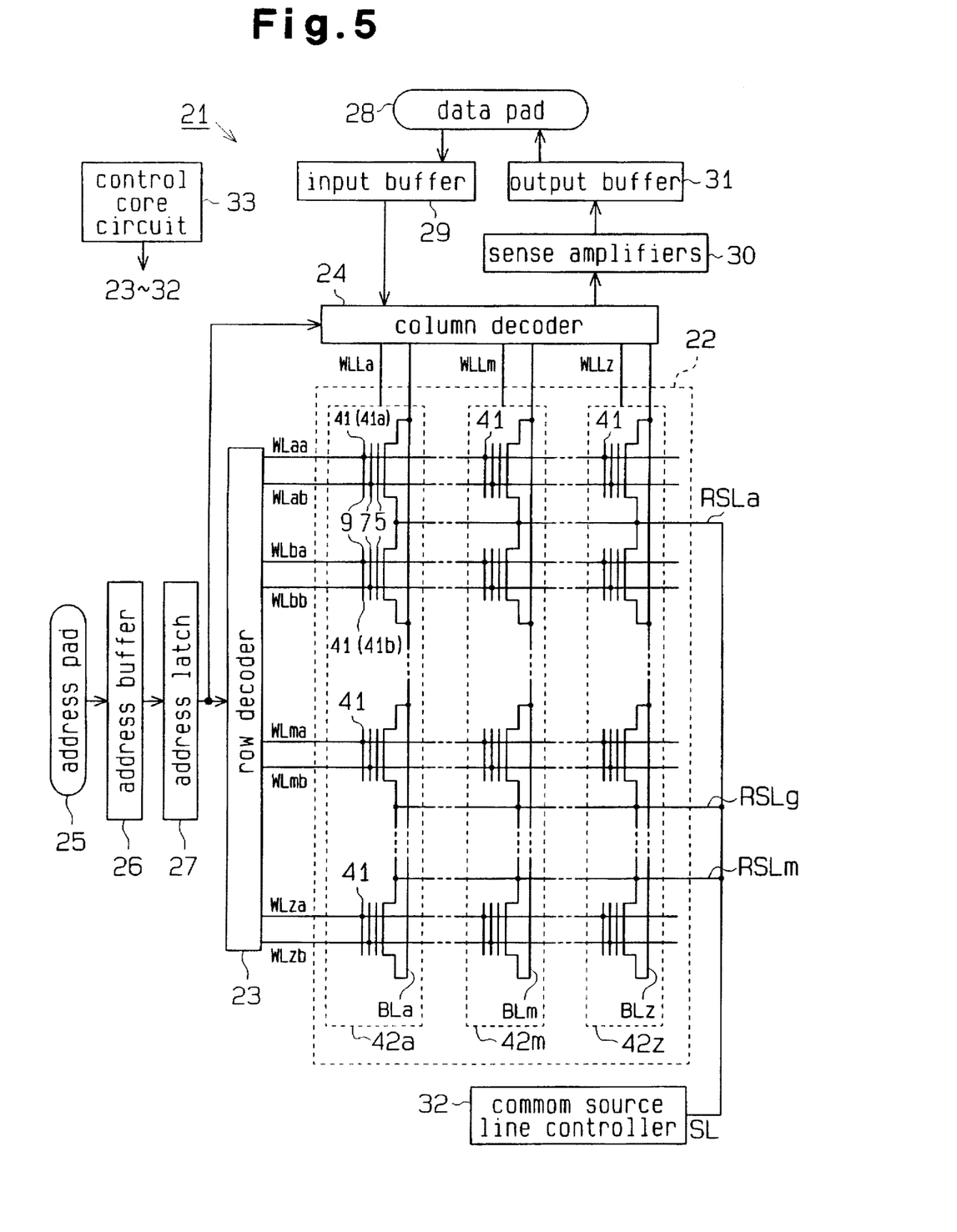
FIG. 5 illustrates the overall structure of the flash EEPROM of the second embodiment.

FIG. 5 illustrates the overall structure of the flash EEPROM 21 of the second embodiment. The memory cells 41 are arranged in a matrix form in the memory cell array 22. The second control gate electrodes 9 of the individual memory cells 41 arranged in rows form common first word lines WLaa to WLza row by row. The first control gate electrodes 7 of the individual memory cells 41 arranged in rows form common second word lines WLab to WLzb row by row. The drain regions D of the individual memory cells 41 arranged in columns are connected to the common bit lines BLa-BLz column by column. The memory cells 41 arranged in columns (or connected to the common bit lines BLa-BLz) are formed on the common well 42. Hereinafter, the individual well portions are denoted by "42a" to "42z" to distinguish them from one another. The individual wells 42a to 42z are independently formed on the substrate 1 and are respectively connected to well select lines WELa to WELz.

The individual memory cells 41a, which are connected to out-numbered first and second word lines (WLaa . . . WLma . . . WLya, WLab . . . WLmb . . . WLyb), and the individual memory cells 41b, which are connected to even-numbered first and second word lines (WLba . . . WLna . . . WLza, WLab . . . WLnb . . . WLzb), share the source regions S. The common source regions S form source lines RSla to RSLm. For example, the individual memory cells 41a connected to the first and second word lines WLaa and WLab and the individual memory cells 41b connected to the first and second word lines WLba and WLbb have the source region S, which forms the source line RSLa. The individual source lines RSLa-RSLm are connected to a common source line SL.

The flash EEPROM 21 has a row decoder 23 connected to the individual first and second word lines WLaa-WLza and WLab-WLzb, and a column decoder 24 connected to the individual bit lines BLa-BLz and the individual well select lines WELa-WELz. The EEPROM 21 further includes an address pad 25 for receiving the row address and column address specified by an external control device, an address buffer 26 and an address latch 27. The address buffer 26 transfers the row address and column address from the address pad 25 to the address latch 27. The address latch 27 latches the addresses and transfers the row address to the row decoder 23 and the column address to the column decoder 24.

Figure 6:
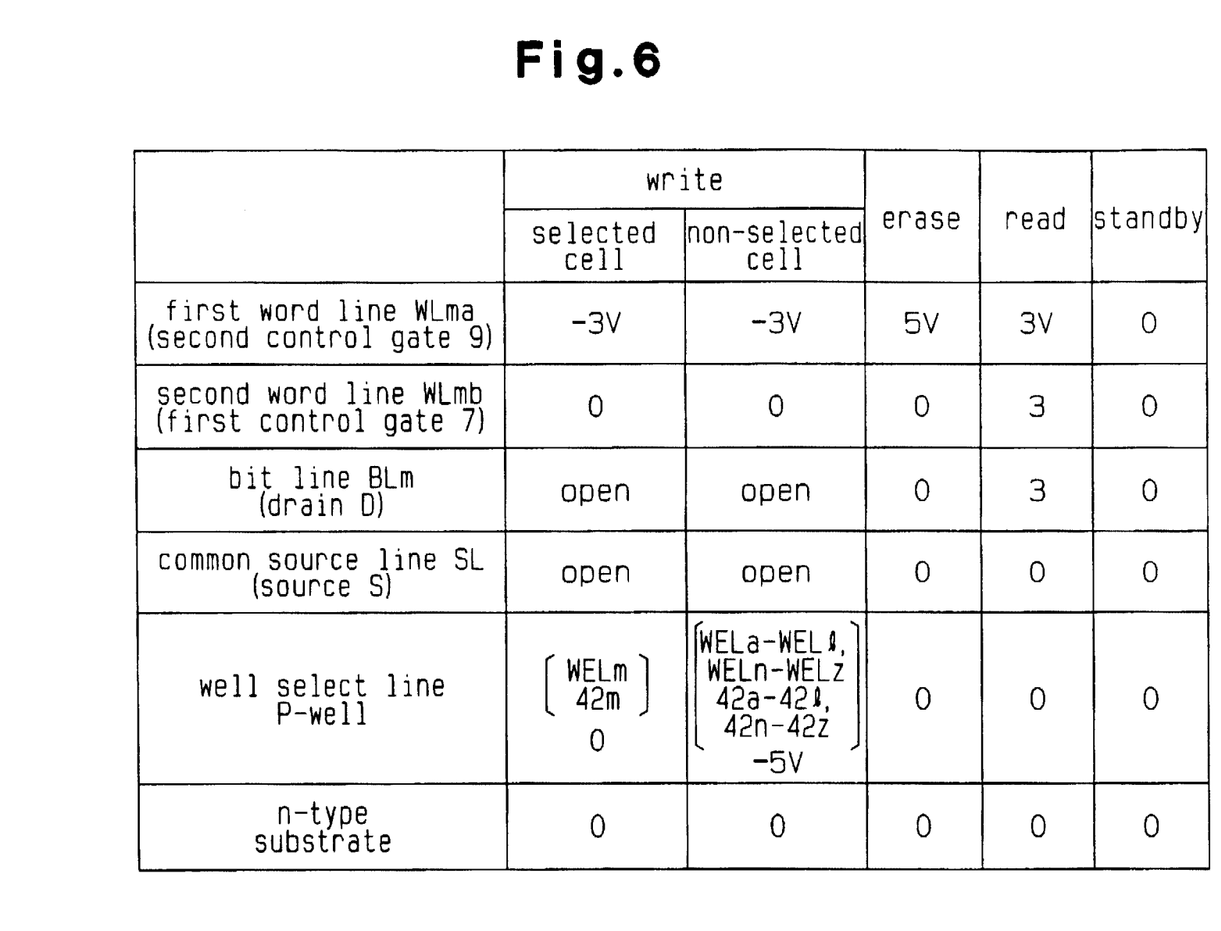
FIG. 6 shows the individual operation modes of the flash EEPROM (write mode, erase mode, read mode and standby mode).

Upon reception of the row address, the row decoder 23 selects one pair from the first and second word lines WLaa-WLza and WLab-WLzb (e.g., WLma and WLmb) in accordance with the row address and controls the voltage to be applied to the selected pair of word lines WLma and WLmb in accordance with the individual operation modes illustrated in FIG. 6. Upon reception of the column address, the column decoder 24 selects one of the bit lines BLa-BLz (e.g., BLm) and one of the well select lines WELa-WELz (e.g., WELm) in accordance with the column address and controls the voltage to be applied to the selected bit line BLm and well select line WELm in accordance with the individual operation modes illustrated in FIG. 6.

The EEPROM 21 has a common source line controller 32 connected to the common source line SL. This common source line controller 32 controls the voltage which is to be applied to the individual source lines RSLa-RSLm via the common source line SL, in accordance with the individual operation modes illustrated in FIG. 6.

The EEPROM 21 further has a data pad 28 for receiving data supplied from the external control device, an input buffer 29, an output buffer 31, a sense amplifier group 30 including a plurality of sense amplifiers (not shown), and a control core circuit 33. The data pad 28 transfers data to the column decoder 24 via the input buffer 29. The column decoder 24 controls the voltages to be applied to the selected one of the bit lines BLa-BLz and the selected one of the well select lines WELa-WELz in accordance with that data. (This control will be discussed later.) The column decoder 24 connects the selected bit line BLm to the associated sense amplifier and transfers data, read from an arbitrary memory cell 41 via the selected bit line BLm, to the sense amplifier group 30. The sense amplifier group 30 supplies the data to the external control device via the output buffer 31 and the data pad 28. The control core circuit 33 controls the operations of the individual circuits 23 to 32.

The individual operation modes of the flash EEPROM 21 (write mode, erase mode, read mode and standby mode) will be now described with reference to FIG. 6. In this specification, the side where a high voltage is applied in the reading operation is treated as the drain region D and the side where low voltage is applied is treated as the source region S. The source region S and drain region D in the writing operation and erasing operation are the same as those in the reading operation. In any operation mode, the potential of the substrate 1 is kept at 0 V.

Write Mode

In the write mode, −3 V is applied to the selected first word line WLma and 0 V is applied to the selected second word line WLmb. 0 V is applied to the non-selected first and second word lines WLaa-WLla, WLna-WLza, WLab-WLlb, and WLnb-WLzb. Further, 0 V is applied to the selected well select line WELm and −5 V is applied to the non-selected well select lines WELa-WEL1 and WELn-WELz. In other words, 0 V is applied to the selected well 42m and −5 V is applied to the non-selected wells 42a-42l and 42n-42z. All the bit lines BLa-BLz and the common source line SL are kept open. As a result, one memory cell 41 associated with the selected first and second word lines WLma and WLmb and the selected well select line WELm (well 42m) is selected.

In the selected memory cell 41, a voltage lower than the one applied to the first control gate 7 connected to the second word line WLmb is applied to the second control gate 9 connected to the first word line WLma. As in the case of the IGFET of the first embodiment, therefore, hot electrons are injected onto the floating gate 5 of the selected memory cell 41. Consequently, 1-bit data is written and stored in the selected memory cell 41. At this time, the individual memory cells which are connected to the first and second word lines WLma and WLmb but are not formed on the selected well 42m become unselected. The wells 42a-42l and 42n-42z of the non-selected memory cells 41 are applied with a voltage lower than the one applied to the second control gate 9. Therefore, no hot electrons are injected onto the floating gate 5 of the non-selected memory cells 41 and no data is written there. This voltage application allows data to be written in the selected single memory cell 41. At this time, damage to the first and second gate oxide films 4 and 6 by the hot electrons injected onto the floating gate 5 is very small as has been discussed in the foregoing description of the first embodiment.

Erase Mode

In the erase mode, 5 V is applied to the selected first word line WLma and 0 V is applied to the selected second word line WLmb. 0 V is applied to the non-selected first and second word lines WLaa-WLla, WLna-WLza, WLab-WLlb, and WLnb-WLzb. Further, 0 V is applied to all the bit lines BLa-BLz, the common source line SL and all the well select lines WELa-WELz. As a result, a row of memory cells 41 associated with the selected first and second word lines WLma and WLmb are selected.

In each of the selected memory cells 41, a voltage higher than the one applied to the first control gate 7 connected to the second word line WLmb is applied to the second control gate 9 connected to the first word line WLma. As in the case of the IGFET of the first embodiment, therefore, hot holes having the opposite conductivity to that of hot electrons are injected onto the floating gate 5 of each selected memory cell 41. Consequently, the hot electrons which have been already injected and retained in the floating gate 5 prior to the erase mode are canceled by the hot holes which have just been injected in the erase mode. Accordingly, data stored in the memory cell 41 is erased. At this time, damage to the first and second gate oxide films 4 and 6 by the hot holes injected onto the floating gate 5 is very small. This permits the number of allowable data rewriting actions of the flash EEPROM 21 to be increased. In other words, the flash EEPROM 21 of the second embodiment can have the same or a greater number of data rewriting actions as compared with a magnetic memory. The flash EEPROM 21 can be therefore replaced with a magnetic memory.

Unlike the writing operation, the erasing operation is performed on one row of memory cells 41, which are associated with the selected first and second word lines WLma and WLmb. This allows the erasure of the individual memory cells 41 to be performed row by row. By simultaneously selecting a plurality of the first and second word lines WLaa-WLza and WLab-WLzb, erasing of all the memory cells 41 associated with those first and second word lines may be executed. This means that a block erasure to erase data block by block, which consists of the memory cells 41 associated with plural pairs of first and second word lines can be accomplished.

Read Mode

In the read mode, 3 V is applied to the selected first and second word lines WLma and WLmb. 0 V is applied to the non-selected word lines WLaa-WLla, WLna-WLza, WLab-WLlb, and WLnb-WLzb. Further, 3 V is applied to the selected bit line BLm, and 0 V is applied to the non-selected bit lines BLa-BLl and BLn-BLz. Further, 0 V is applied to the common source line SL and all the well select lines WELa-WELz. As a result, a single memory cell 41 associated with the selected first and second word lines WLma and WLmb and the selected bit line BLm is selected.

The floating gate 5 of the data-written memory cell 41 is retaining the injected hot electrons so that the channel region 3 of the memory cell 41 is disabled. The floating gate 5 of the erased memory cell 41 is not retaining the injected hot electrons so that the channel region 3 of this memory cell 42 is enabled. When 3 V is applied to both the first and second control gates 7 and 9 of the selected memory cell 41, therefore, the cell current which flows toward the source region S from the drain region D of the data-written memory cell 41 is smaller than the cell current which flows to the erased memory cell 41. Each sense amplifier in the sense amplifier group 30 compares the cell current flowing through each associated memory cell 41 with a reference current to determine the data value that has been written in the selected memory cell 41. This permits data stored in the selected single memory cell 41 to be read out. The data value stored in the selected memory cell 41 is read out in this manner. For example, the reading operation is carried out with the data value in the written memory cell 41 as "1" and the data value in the erased memory cell 41 as "0".

Standby Mode

In the standby mode, 0 V is applied to all the word lines WLaa-WLza and WLab-WLzb, all the bit lines BLa-BLz, all the well select lines WELa-WELz and the common source line SL. In this standby mode, no operations (writing, erasing and reading) are performed on all the memory cells 41.

Third Embodiment

Figure 8A:
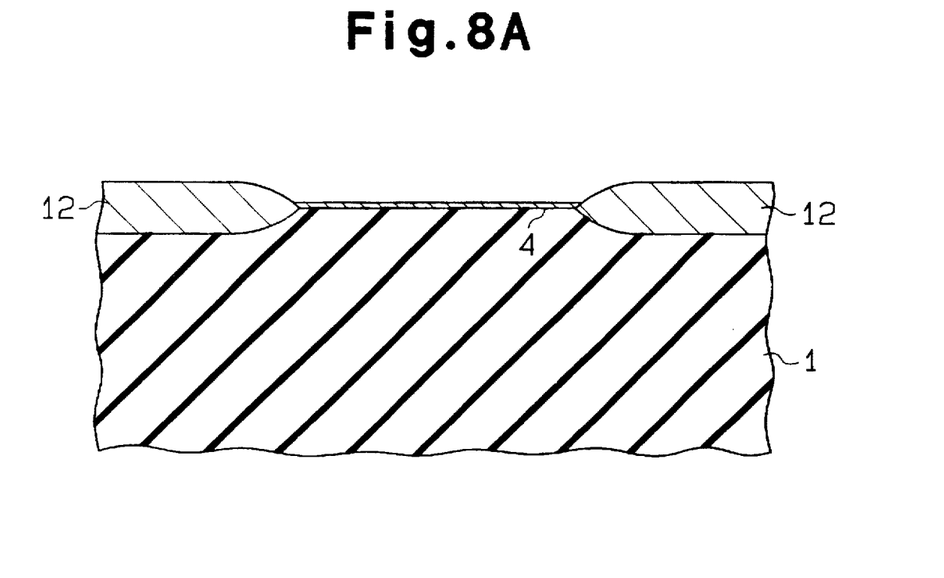
FIGS. 8A, 8B and 9 are schematic cross-sectional views illustrating the fabrication process of the IGFET according to the second embodiment.
Figure 8B:
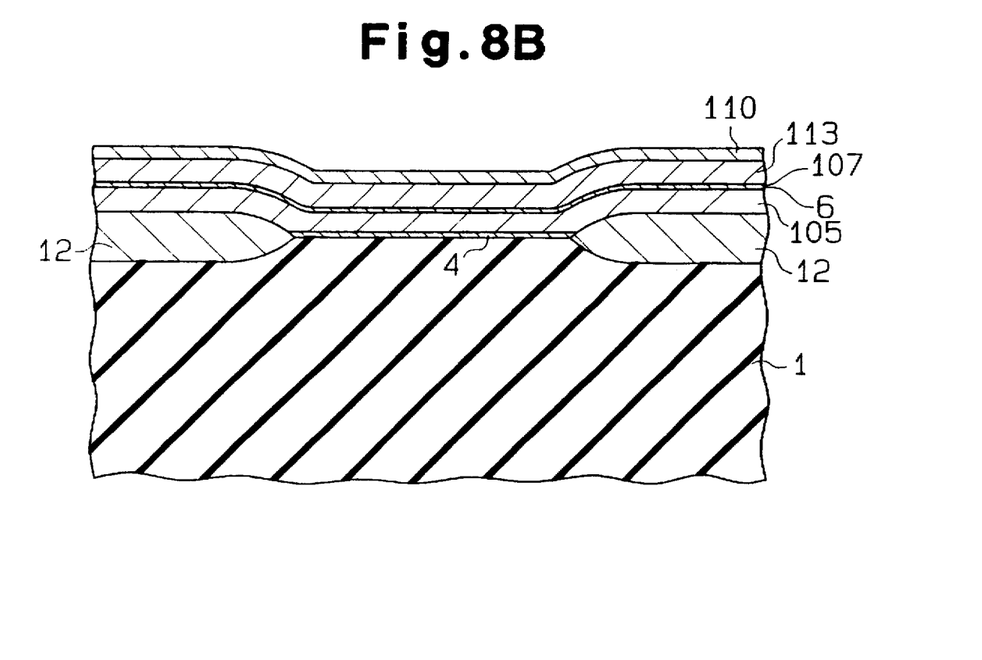
Figure 9:
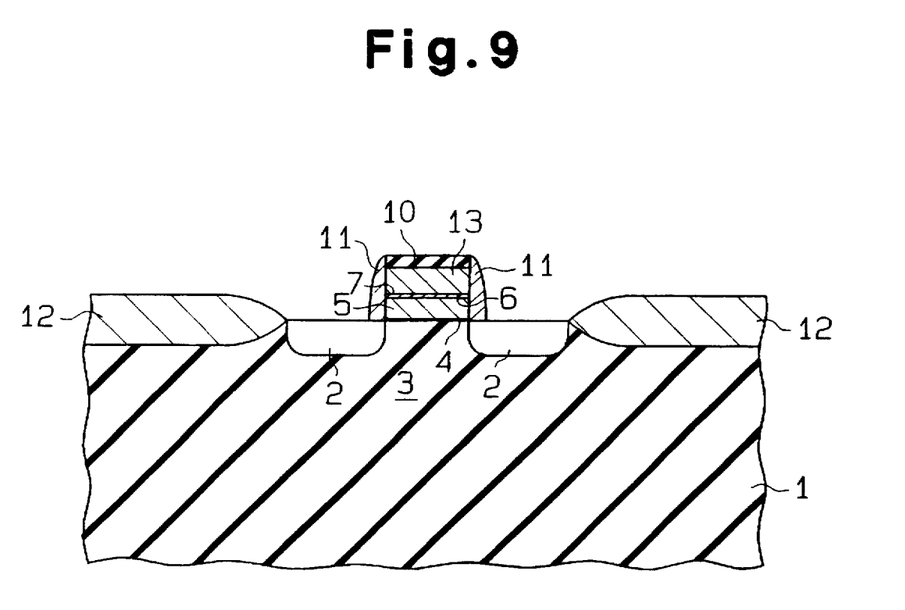

The third embodiment of this invention will be described below with reference to FIGS. 7 through 9. To avoid a redundant description, like or same reference numerals are given to those components which are the same as the corresponding components of the first embodiment.

Figure 7:
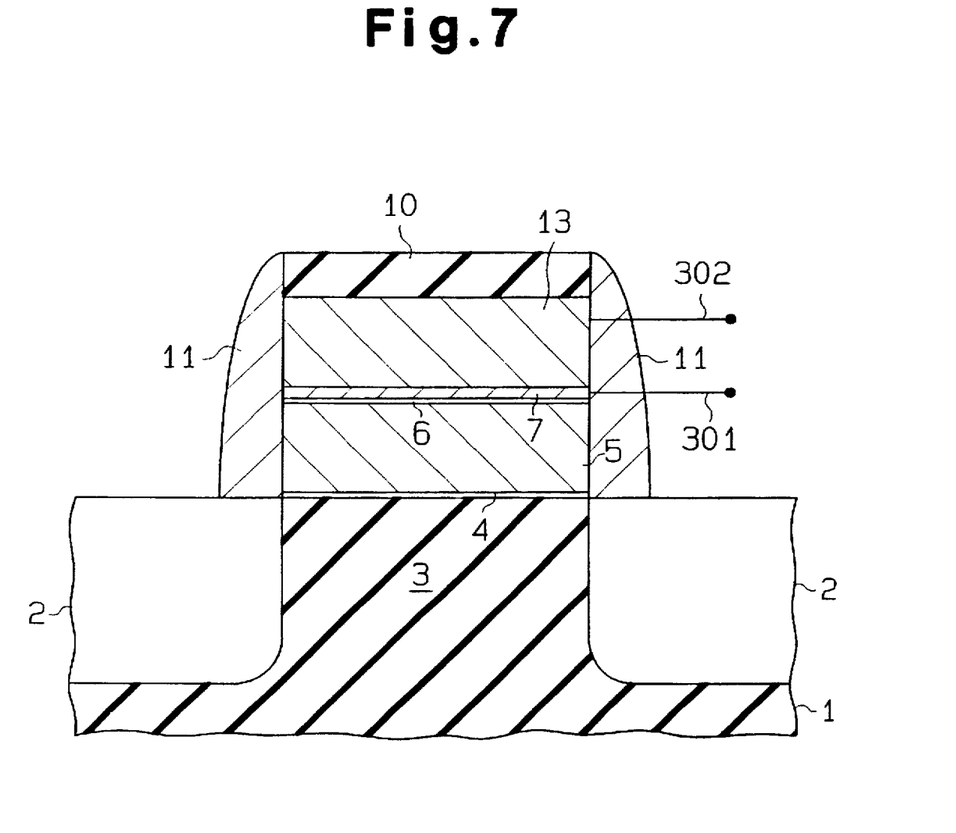
FIG. 7 is a schematic cross-sectional view showing an IGFET according to the second embodiment of this invention.

FIG. 7 presents a schematic cross-sectional view illustrating an IGFET according to the third embodiment. The third embodiment differs from the first embodiment in the structure of the control gate. In the third embodiment, the first gate oxide film 4 (thickness: 10 nm), the floating gate 5 (thickness: 200 nm), the second gate oxide film 6 (thickness: 10 nm), the first control gate 7 (thickness: 20 nm), a second control gate 13 made of metal (thickness: 200 nm), and the insulating film 10 (thickness: 100 nm) are formed in order on the channel region 3. The first and second control gates 7 and 13 constitute a Schottky junction. This Schottky junction allows the control of the energy of the hot electrons or hot holes to be injected onto the floating gate 5. The first and second control gates 7 and 13 are respectively connected to first and second wires 301 and 302. The floating gate 5 may be formed by a conductive film like a metal film, instead of a doped polysilicon film. The first control gate 7 may be replaced with silicon carbide.

This third embodiment can reset the first threshold voltage VTnormal to the second threshold voltage VTestab in the same manner as the first embodiment. To acquire the second threshold voltage VTestab which is higher than the first threshold voltage VTnormal (VTestab>VTnormal), predetermined voltages are applied to the first and second control gates 7 and 13 and the substrate 1, respectively. At this time, a voltage higher than the one applied to the second control gate 13 is applied to the first control gate 7. As a result, a predetermined amount of hot electrons are injected onto the floating gate 5 from the first control gate 7 in accordance with the FN tunnel current flowing to the first control gate 7 from the floating gate 5. As described above, The predetermined voltages are respectively applied to the first and second control gates 7 and 13, which form the Schottky junction. This allows to control the energy of the hot electrons and to be injected the hot electrons having a relatively small energy onto the floating gate 5.

To acquire the second threshold voltage VTestab which is lower than the first threshold voltage VTnormal (VTestab<VTnormal), predetermined voltages are applied to the first and second control gates 7 and 13 and the substrate 1, respectively. At this time, a voltage lower than the one applied to the second control gate 13 is applied to the first control gate 7. As a result, a predetermined amount of hot holes are injected onto the floating gate 5 from the first control gate 7 in accordance with the FN tunnel current flowing to the floating gate 5 from the first control gate 7. As described above, The predetermined voltages are respectively applied to the first and second control gates 7 and 13, which form the Schottky junction. This allows to control the energy of the hot holes and to be injected the hot holes having a relatively small energy onto the floating gate 5.

Like the second embodiment, the third embodiment may be adapted to memory cells (memory cell transistors) of a flash EEPROM. In this case, the floating gate 5 retains hot carriers. The first and second control gates 7 and 13 are used to detect the change of the threshold voltage which varies in accordance with the amount of hot carriers retained in the floating gate 5 and to read out data.

The method of manufacturing the IGFET according to the third embodiment will be now discussed with reference to FIGS. 8A, 8B and 9.

Step 1 (see FIG. 8A): This step is the same as the step 1 of the first embodiment (see FIG. 2A).

Step 2 (see FIG. 8B): The first doped polysilicon film 105, the second gate oxide film 6, and the second doped polysilicon film 107 are formed in order on the first gate oxide film 4 and field oxide film 12 by CVD. Next, a metal film 113 of aluminum, tungsten or the like is formed on the second doped polysilicon film 107 by PVD. Then, the silicon oxide film 110 is formed on the metal film 113 by CVD. It is desirable to form the silicon oxide film 110 having a thickness of 100 to 500 nm.

Step 3 (see FIG. 9): The individual films 4, 6, 105, 107, 113 and 110 are patterned by anisotropic etching to form the floating gate 5, the first and second control gates 7 and 13, and the insulating film 10. The subsequent process is the same as that of the first embodiment.

Although only three embodiments of the present invention have been described herein, it should be apparent to those skilled in the art that the present invention may be embodied in many other specific forms without departing from the spirit or scope of the invention. Particularly, it should be understood that the invention may be embodied in the following forms.

In the second embodiment, the hot holes may be injected onto the floating gate 5 in the write mode and the hot electrons may be injected onto the floating gate 5 in the erase mode.

In the third embodiment, the second control gate 13 made of metal may be formed by CVD. When the second control gate 13 is made of tungsten, for example, the second control gate 13 may be formed of tungsten CVD. This method permits the individual films 4, 6, 105, 107, 113 and 110 to be continuously formed by a single CVD apparatus.

The invention may be adapted for a EEPROM which cannot wholly perform the erasing of data and for an erasable programmable ROM (EPROM).

In the manufacturing step 3 of the first and third embodiments, after the side wall spacers 11 are formed, arsenic ions having energy of 50 keV are may be injected at a dose of $5 \times 10^{15}$ cm$^{-2}$ onto the entire surface of the device. Accordingly, an IGFET with a lightly doped drain (LDD) construction is formed. The IGFET reduces a contact resistance between the source/drain region 2 and a source/drain electrode (not shown).

In the first and third embodiments, the hot electrons retained in the floating gate 5 may be drained therefrom, instead of the injection of the hot holes onto the floating gate 5. For example, a predetermined voltage is applied to the first and second control gates 7 and 9 (or 7 and 13). As a result, the FN tunnel current flows to the floating gate 5 from the first and second control gate 7 and 9 (or 7 and 13) so that the hot electrons are drained from the floating gate 5. At this time, damage to the second oxide film 6 by the hot electrons drained from the first and second control gate 7 and 9 is small.

In the second embodiment, the erase mode may be altered hereinafter. 15 V is applied to the both selected first and second word lines WLma and WLmb. 0 V is applied to all the bit lines BLa-BLz, the common source line SL and all the well select lines WELa-WELz. As a result, a row of memory cells 41 associated with the selected first and second word lines WLma and WLmb are selected. In each of the selected memory cells 41, the FN tunnel current flows to the floating gate 5 from the first and second control gates 7 and 9 so that the hot electrons which have been already injected and retained in the floating gate 5 prior to the erase mode are drained therefrom. Accordingly, data stored in the memory cell 41 is erased. At this time, damage to the second gate oxide films 6 by the hot electrons injected onto the floating gate 5 is small.

Therefore, the present examples and embodiments are to be considered as illustrative and not restrictive and the invention is not to be limited to the details given herein, but may be modified within the scope of the appended claims.

What is claimed is:

1. A semiconductor device comprising:

a semiconductor substrate;

source and drain regions defined in said semiconductor substrate, with a channel region therebetween;

a first insulating layer located over said semiconductor substrate including over said channel region;

a floating gate locating over said first insulating layer;

a second insulating layer located over said floating gate;

a first control gate located over said second insulating layer; and a second control gate located over said first control gate, wherein said first and second control gates constitute a Schottky junction and allow the injection of hot carriers onto said floating gate from said first control gate when predetermined first and second voltages are applied to said first and second control gates, respectively.

2. A method of resetting a predetermined first threshold voltage of a semiconductor device to a second threshold voltage, wherein said semiconductor device includes a source, a drain, a floating gate, a first control gate and a second control gate, said floating gate being capacitively coupled to said first control gate, wherein said first and second control gates constitute a Schottky junction, said method comprising the steps of:

applying a predetermined first reset voltage to said first control gate;

applying a predetermined second reset voltage to said second control gate;

injecting hot carriers onto said floating gate from said first control gate through said insulating layer; and resetting said predetermined first threshold voltage to said second threshold voltage.

3. The method according to claim 2, wherein said step of injecting includes the step of injecting hot electrons as said hot carriers onto said floating gate from said first control gate when said predetermined first reset voltage is higher than said predetermined second reset voltage, and wherein said step of resetting includes the step of resetting said predetermined first threshold voltage to said second threshold voltage, which is higher than said predetermined first threshold voltage.

4. A method of operating an electrically programmable memory cell comprising a source, a drain, a floating gate, a first control gate and a second control gate, said floating gate being capacitively coupled to said first control gate, wherein said first control gate and said second control gate constitute a Schottky junction, said method comprising the steps of:

applying a predetermined first write voltage to said first control gate;

applying a predetermined second write voltage to said second control gates;

injecting first hot carriers having a first conductivity onto said floating gate from said first control gate; and storing data in said memory cell.

5. The method according to claim 4 further comprising the steps of:

applying a predetermined first read voltage to said first control gate;

applying a predetermined second read voltage being equal or different to or from said first read voltage to said second control gate;

flowing a current between said source and said drain; and reading data stored in said memory cell by outputting said current therefrom.

6. A method of operating an electrically programmable semiconductor memory device having a plurality pair of first and second row address lines, a plurality of column address lines, a plurality of well select lines corresponding to said plurality of column address lines, a plurality of common wells coupled to said plurality of well select lines and a plurality of memory cells defined by said plurality pair of first and second row address lines and said plurality of column address lines, each of said memory cells comprising a first and second control gates coupled to an associated one pair of said plurality pair of first and second row address lines, a floating gate, a first impurity region coupled to an associated one of said plurality of column address lines, a second impurity region, said first and second impurity regions being defined in an associated one of said plurality of common wells, said floating gate being capacitively coupled to said first control gate, wherein said first and second control gates constitute a Schottky junction, said method comprising the steps of:

applying a predetermined first and a predetermined second write voltages to at least one pair of said plurality pair of first and second row address lines, respectively;

applying a predetermined third write voltage to at least one of said plurality of well select lines;

injecting first hot carriers having a first conductivity onto said floating gate from said first control gate; and storing data in at least one of said memory cells.

7. The method according to claim 6 further comprising the steps of:

applying a predetermined first read voltage to at least one pair of said plurality pair of first and second row address lines;

applying a predetermined second read voltage to said plurality of well select lines;

applying a predetermined third read voltage to at least one of said plurality of column address lines;

flowing a current between said first and second impurity regions; and reading data stored in at least one of said memory cells by outputting said current therefrom.

8. An electrically programmable semiconductor memory device comprising:

a memory cell array having a plurality pair of first and second row address lines, a plurality of column address lines, a plurality of well select lines corresponding to said plurality of column address lines, a plurality of common wells coupled to said plurality of well select lines and a plurality of memory cells which are selectable by said plurality pair of first and second row address lines and said plurality of column address lines, each of said memory cells comprising a first and second control gates coupled to an associated one pair of said plurality pair of first and second row address lines, a floating gate, a first impurity region coupled to an associated one of said plurality of column address lines, a second impurity region, said first and second impurity regions being defined in an associated one of said plurality of common wells, said floating gate being capacitively coupled to said first control gate, wherein said first and second control gates constitute a Schottky junction; and writing means for applying a predetermined first and a predetermined second write voltages to at least one pair of said plurality pair of first and second row address lines respectively and for applying a predetermined third write voltage to at least one of said plurality of well select lines to cause first hot carriers having a first conductivity to be injected onto said floating gate from said first control gate, thereby storing data in at least one of said memory cells.

9. The memory device according to claim 8 further comprising:

reading means for applying a predetermined first read voltage to at least one pair of said plurality pair of first and second row address lines for applying a predetermined second read voltage to said plurality of well select lines and for applying a predetermined third read voltage to at least one of said plurality of column address lines to flow a current between said first and second impurity regions, thereby reading data stored in at least one of said memory cells by outputting said current therefrom.

* * * * *